United States Patent
Park et al.

(10) Patent No.: US 11,430,859 B2
(45) Date of Patent: Aug. 30, 2022

(54) DISPLAY DEVICE FOR DRIVING AT HIGH SPEED

(71) Applicant: Samsung Display Co., Ltd., Yongin-Si (KR)

(72) Inventors: Joon Seok Park, Yongin-si (KR); Myounghwa Kim, Seoul (KR); Tae Sang Kim, Seoul (KR); Hyungjun Kim, Seoul (KR); Yeon Keon Moon, Hwaseong-si (KR); Geunchul Park, Suwon-si (KR); Sangwoo Sohn, Yongin-si (KR); Jun Hyung Lim, Seoul (KR); Kyung Jin Jeon, Incheon (KR); Hye Lim Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 16 days.

(21) Appl. No.: 16/885,598

(22) Filed: May 28, 2020

(65) Prior Publication Data

US 2021/0098561 A1    Apr. 1, 2021

(30) Foreign Application Priority Data

Sep. 26, 2019  (KR) .................. 10-2019-0119032

(51) Int. Cl.
*H01L 29/08*   (2006.01)
*H01L 27/32*   (2006.01)

(52) U.S. Cl.
CPC ...... *H01L 27/3279* (2013.01); *H01L 27/3262* (2013.01); *H01L 27/3265* (2013.01); *H01L 27/3272* (2013.01)

(58) Field of Classification Search
CPC ............. H01L 27/3279; H01L 27/3262; H01L 27/3265; H01L 27/3272

(Continued)

(56) References Cited

U.S. PATENT DOCUMENTS

2008/0105873 A1* 5/2008 Wang .................. H01L 27/1248
                                                         257/59
2011/0221733 A1* 9/2011 Sato ........................ G09G 3/006
                                                         345/211

(Continued)

FOREIGN PATENT DOCUMENTS

| KR | 101740192 B1 | 5/2017 |
|----|-------------|--------|
| KR | 1020170078075 A | 7/2017 |
| KR | 1020180003721 A | 1/2018 |

OTHER PUBLICATIONS

Rongsheng Chen et al., "Self-aligned top-gate InGaZnO thin film transistors using SiO2/Al2O3 stack gate dielectric," Thin Solid Films, 548 (2013) pp. 572-575, Elsevier B.V.

(Continued)

*Primary Examiner* — Phuc T Dang
(74) *Attorney, Agent, or Firm* — Cantor Colburn LLP

(57) ABSTRACT

A display device includes a first pixel, a second pixel, a first data line connected to the first pixel, and a second data line connected to the second pixel. Each of the first pixel and the second pixel includes a transistor including a conductive layer, a semiconductor layer on the conductive layer, a gate electrode on the semiconductor layer, and a source/drain electrode connected to the semiconductor layer, a capacitor including a first capacitor electrode in a same layer as the gate electrode and a second capacitor electrode on the first capacitor electrode, and a light emitting device on the transistor and the capacitor. The first data line is in a same layer as the source/drain electrode, and the second data line is in a same layer as one of the conductive layer and the second capacitor electrode.

21 Claims, 14 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2013/0270527 A1 | 10/2013 | Kwon et al. | |
| 2015/0187859 A1 | 7/2015 | Choi et al. | |
| 2017/0025487 A1 | 1/2017 | Byun et al. | |
| 2017/0162637 A1* | 6/2017 | Choi | G09G 3/20 |
| 2019/0235675 A1* | 8/2019 | Wu | G06F 3/0448 |
| 2019/0326382 A1* | 10/2019 | Park | H01L 27/3272 |

OTHER PUBLICATIONS

Extended European Search Report for Application No. 20189997.8-1211 dated Jan. 13, 2021.

* cited by examiner

DISPLAY DEVICE FOR DRIVING AT HIGH SPEED

This application claims priority to Korean Patent Application No. 10-2019-0119032, filed on Sep. 26, 2019, and all the benefits accruing therefrom under 35 USC § 119, the content of which in its entirety is herein incorporated by reference.

BACKGROUND

1. Field

Embodiments relate to a display device. More particularly, embodiments relate to a display device driven with a high speed.

2. Description of the Related Art

As the technology related to a display device, the display device has become larger in size, higher in resolution, and faster in speed. Accordingly, in such a display device, gate signals may be applied to a larger number of gate lines for a predetermined period of time. Therefore, the time for allowing the data signal to be inputted to the pixel may be reduced.

SUMMARY

In a display device where the time for allowing the data signal to be inputted to the pixel is reduced, as described above, the number of data lines may increase to compensate for the reduction of the time for the data signal inputted to the pixel. The number of conductive layers included in the display device may increase r to provide more data lines in a limited space. When the number of conductive layers increases, the number of mask processes for forming the conductive layers may increase, and thus manufacturing time and manufacturing cost of the display device may increase.

Embodiments provide a display device driven with a high speed and manufactured with a reduced number of mask processes.

According an embodiment of the invention, a display device includes a first pixel, a second pixel adjacent to the first pixel in a predetermined direction, a first data line extending in the predetermined direction and connected to the first pixel, and a second data line extending in the predetermined direction and connected to the second pixel. In such an embodiment, each of the first pixel and the second pixel includes a transistor including a conductive layer, a semiconductor layer disposed on the conductive layer, a gate electrode disposed on the semiconductor layer, and a source/drain electrode connected to the semiconductor layer, a capacitor including a first capacitor electrode disposed in a same layer as the gate electrode and a second capacitor electrode disposed on the first capacitor electrode, and a light emitting device disposed on the transistor and the capacitor. In such an embodiment, the first data line is disposed in a same layer as the source/drain electrode, and the second data line is disposed in a same layer as one of the conductive layer and the second capacitor electrode.

In an embodiment, the first data line may be integrally formed with the source/drain electrode of the transistor of the first pixel.

In an embodiment, the first data line and the second data line may overlap each other when viewed in a plan view.

In an embodiment, the display device may further include a buffer layer disposed between the conductive layer and the semiconductor layer, a first insulating layer disposed between the semiconductor layer and the gate electrode, a second insulating layer disposed between the first capacitor electrode and the second capacitor electrode, and a third insulating layer disposed between the second capacitor electrode and the source/drain electrode.

In an embodiment, the second data line may be disposed in a same layer as the second capacitor electrode, and the second data line may be connected to the source/drain electrode of the transistor of the second pixel through a contact hole defined through the third insulating layer.

In an embodiment, the second data line may be disposed in a same layer as the conductive layer, and the second data line is connected to the source/drain electrode of the transistor of the second pixel through a contact hole defined through the buffer layer, the first insulating layer, the second insulating layer and the third insulating layer.

In an embodiment, the display device may further include a third data line extending in the predetermined direction and connected to the second pixel. The second data line may be disposed in a same layer as the second capacitor electrode, and the third data line may be disposed in a same layer as the conductive layer.

In an embodiment, the first data line, the second data line, and the third data line may overlap each other when viewed in a plan view.

In an embodiment, the second data line may be connected to the source/drain electrode of the transistor of the second pixel through a contact hole defined through the third insulating layer, and the third data line may be connected to the source/drain electrode of the transistor of the second pixel through a contact hole defined through the buffer layer, the first insulating layer, the second insulating layer and the third insulating layer.

In an embodiment, the second data line may include a material having an electrical resistance less than an electrical resistance of the gate electrode.

In an embodiment, the display device may further include a plurality of pixel rows arranged along the predetermined direction. In such an embodiment, the first pixel may be included in an odd-numbered pixel row of the plurality of pixel rows, and the second pixel may be included in an even-numbered pixel row of the plurality of pixel rows.

In an embodiment, the semiconductor layer may include at least one material selected from an amorphous silicon, a polycrystalline silicon, and a metal oxide.

According to an embodiment of the invention, a display device includes a first pixel, a second pixel adjacent to the first pixel in a predetermined direction, a first data line extending in the predetermined direction and connected to the first pixel, and a second data line extending in the predetermined direction and connected to the second pixel. In such an embodiment, each of the first pixel and the second pixel includes a transistor including a conductive layer, a semiconductor layer disposed on the conductive layer, a gate electrode disposed on the semiconductor layer, and a source/drain electrode connected to the semiconductor layer and a light emitting device disposed on the transistor. In such an embodiment, the first data line is disposed in a same layer as the source/drain electrode, and the second data line is disposed in a same layer as the conductive layer.

In an embodiment, the display device may further include a buffer layer disposed between the conductive layer and the semiconductor layer, a first insulating layer disposed between the semiconductor layer and the gate electrode, and a second insulating layer disposed between the gate electrode and the source/drain electrode.

In an embodiment, the second data line may be connected to the source/drain electrode of the transistor of the second pixel through a contact hole defined through the buffer layer, the first insulating layer and the second insulating layer.

In an embodiment, each of the first pixel and the second pixel may further include a capacitor including a first capacitor electrode disposed in a same layer as the conductive layer and a second capacitor electrode disposed on the first capacitor electrode.

In an embodiment, the second capacitor electrode may be disposed in a same layer as the gate electrode.

In an embodiment, the second capacitor electrode may be disposed in a same layer as the semiconductor layer.

According to an embodiment of the invention, a display device includes a first pixel, a second pixel adjacent to the first pixel in a predetermined direction, a first data line extending in the predetermined direction and connected to the first pixel, and a second data line extending in the predetermined direction and connected to the second pixel. In such an embodiment, each of the first pixel and the second pixel includes a transistor including a semiconductor layer, a gate electrode disposed on the semiconductor layer, and a source/drain electrode connected to the semiconductor layer, a capacitor including a first capacitor electrode disposed in a same layer of the gate electrode and a second capacitor electrode disposed on the first capacitor electrode, and a light emitting device disposed on the transistor and the capacitor. In such an embodiment, the first data line is disposed in a same layer as the source/drain electrode, and the second data line is disposed in a same layer as the second capacitor electrode.

In an embodiment, the display device may further include a first insulating layer disposed between the semiconductor layer and the gate electrode, a second insulating layer disposed between the first capacitor electrode and the second capacitor electrode, and a third insulating layer disposed between the second capacitor electrode and the source/drain electrode.

In an embodiment, the second data line may be connected to the source/drain electrode of the transistor of the second pixel through a contact hole defined through the third insulating layer.

In embodiments of the invention, the display device may include the first data line and the second data line respectively connected to the first pixel and the second pixel which are included different pixel rows from each other, the first data line may be disposed in a same layer as the source/drain electrode of the transistor, and the second data line may be disposed in a same layer as the second capacitor electrode of the capacitor. Accordingly, the display device may be driven with high speed, and the number of the mask processes in the manufacturing process of the display device may be reduced.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
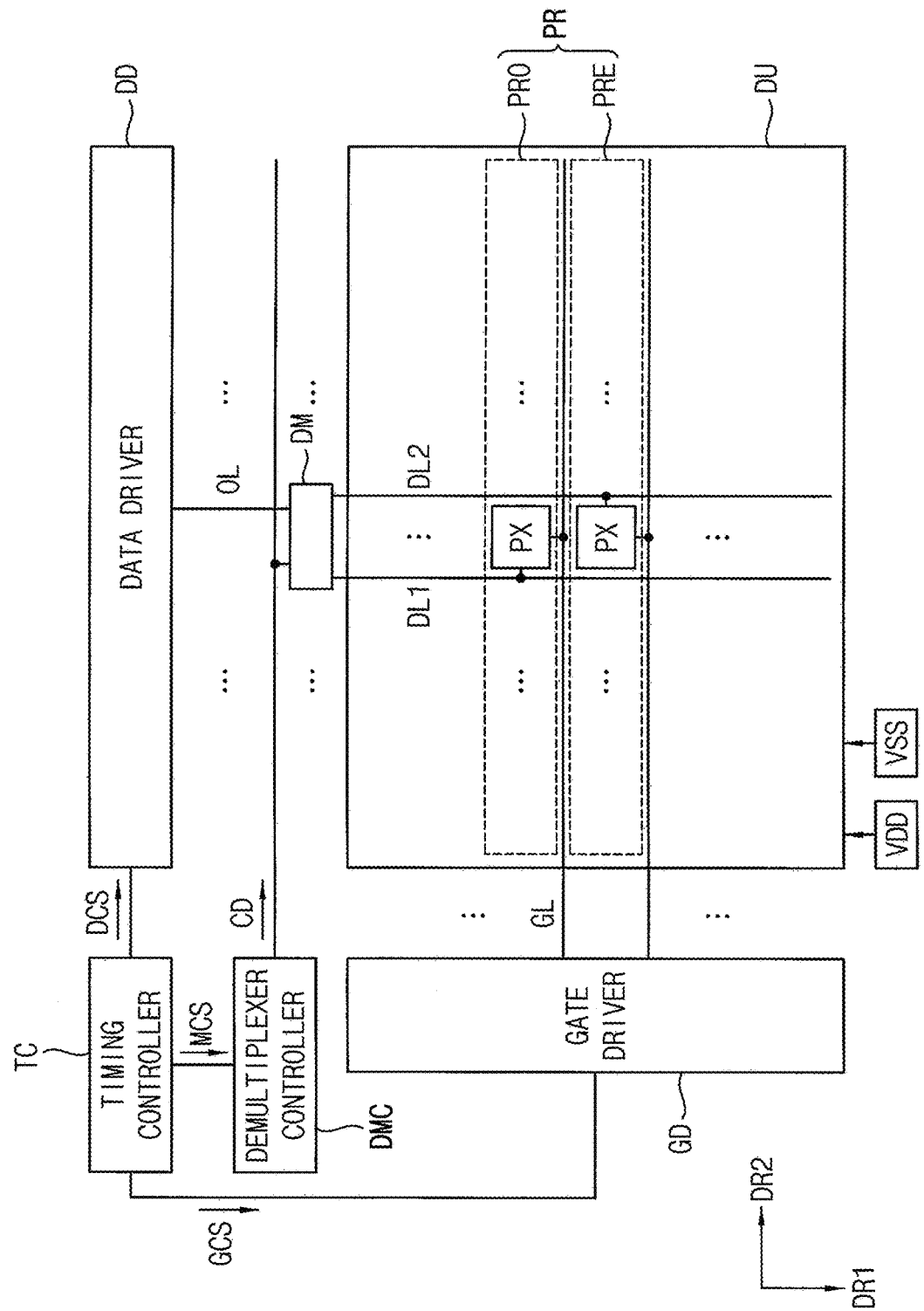
FIG. 1 is a view illustrating a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of a display device will be described in detail with reference to the accompanying drawings.

FIG. 1 is a view illustrating a display device according to an embodiment of the present invention.

Referring to FIG. 1, an embodiment of the display device according to one the invention may include a display unit DU, a gate driver GD, a data driver DD, demultiplexers DM, a demultiplexer controller DMC, and a timing controller TC. The display unit DU may include a plurality of pixels PX. The pixels PX may be arranged in a substantially matrix form along a first direction DR1 and a second direction DR2 intersecting the first direction DR1. Accordingly, the display unit DU may include a plurality of pixel rows PR arranged along the first direction DR1. The pixel rows PR may include a plurality of odd-numbered pixel rows PRO and a plurality of even-numbered pixel rows PRE that are alternately arranged in the first direction DR1.

The gate driver GD may supply gate signals to gate lines GL in response to a gate driver control signal GCS provided from the timing controller TC. In one embodiment, for example, the gate driver GD may sequentially supply gate signals to the gate lines GL. When the gate signals are sequentially supplied to the gate lines GL, the pixels PX may be sequentially selected in a unit of pixel row PR.

The data driver DD may supply data signals to output lines OL in response to a data driver control signal DCS provided from the timing controller TC. The data driver DD may supply the data signals to the demultiplexers DM through the output lines OL.

The demultiplexers DM may receive the data signals from the data driver DD, and supply the data signals to data lines DL1 and DL2. In one embodiment, for example, the demultiplexers DM may receive the data signals through the output lines OL, and time-divisionally output the data signals to data lines DL1 and DL2, the number of which is greater than the number of the output lines OL. Accordingly, each of the pixels PX may receive the data signals through the data lines DL1 and DL2. In one embodiment, for example, the number of the data lines DL1 and DL2 may be twice the number of the output lines OL of the data driver DD.

In an embodiment, a capacitor may be defined or formed in each of the data lines DL1 and DL2 to store the signals applied to the data lines DL1 and DL2. In such an embodiment, the capacitors defined or formed in the data lines DL1 and DL2 may be due to parasitic capacitance. In addition, the capacitors may be physically formed in the data lines DL1 and DL2.

The demultiplexer controller DMC may control operations of the demultiplexers DM through a driving signal CD. In one embodiment, for example, the driving signal CD may serve to control operations of transistors included in the demultiplexers DM, respectively. The demultiplexer controller DMC may receive a demultiplexer control signal MCS supplied from the timing controller TC, and generate the driving signal CD corresponding thereto. In an embodiment, as shown in FIG. 1, the demultiplexer controller DMC may be separated from the timing controller TC, but not being limited thereto. Alternatively, the demultiplexer controller DMC may be integrated with the timing controller TC.

In an embodiment, the timing controller TC may control the gate driver GD, the data driver DD, and the demultiplexer controller DMC. In such an embodiment, the timing controller TC may supply the gate driver control signal GCS, the data driver control signal DCS, and the demultiplexer control signal MCS to the gate driver GD, the data driver DD, and the demultiplexer controller DMC, respectively.

A first power supply VDD and a second power supply VSS may provide power voltages to the display unit DU. The first power supply VDD may be a high potential voltage source, and the second power supply VSS may be a low potential voltage source. In one embodiment, for example, the first power supply VDD may provide a positive voltage to the display unit DU, and the second power supply VSS may provide a negative voltage or ground voltage to the display unit DU.

The pixel rows PR may be connected to the gate lines GL, respectively. The pixels PX may be connected to the first power supply VDD and the second power supply VSS, and provided with the power voltages therefrom. Each of the pixels PX may control an amount of current flowing from the first power supply VDD to the second power supply VSS via a light emitting device in response to the data signal, and the light emitting device included in each of the pixels PX may generate light having luminance corresponding to the amount of current.

Figure 2:
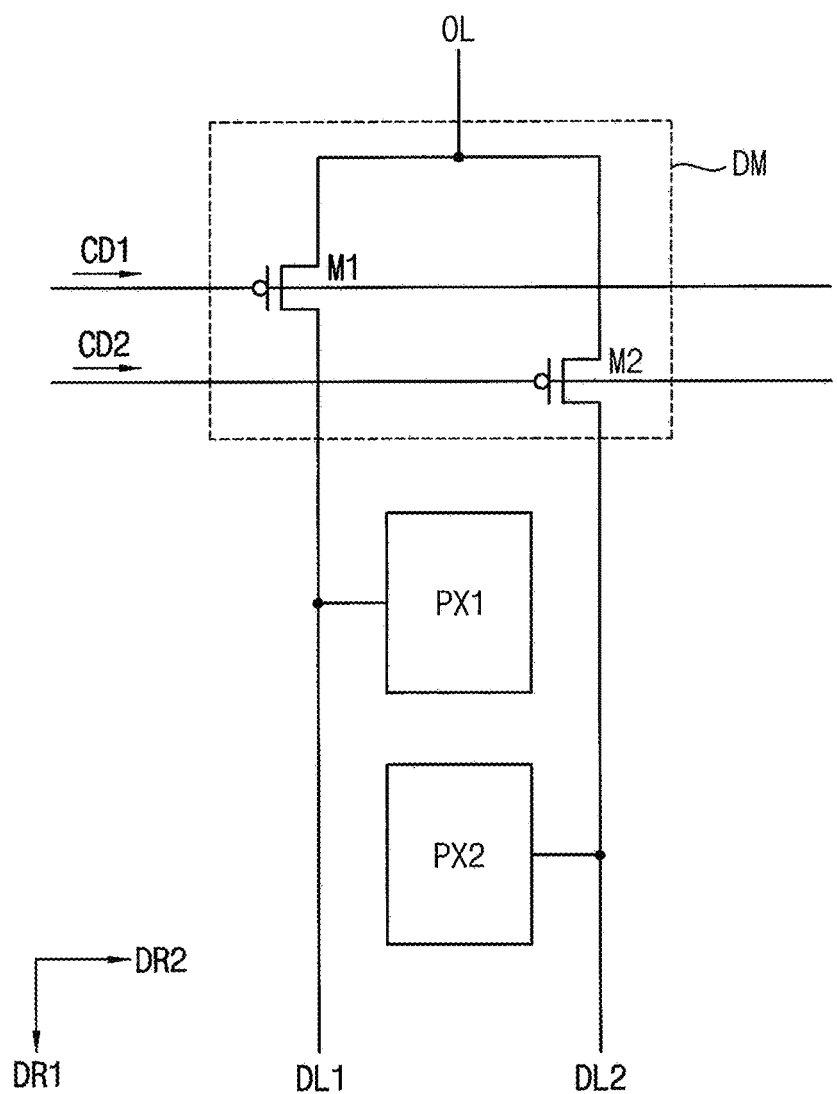
FIG. 2 is a view illustrating the demultiplexer DM show in FIG. 1 and the pixels PX1 and PX2 connected thereto.

FIG. 2 is a view illustrating the demultiplexer DM show in FIG. 1 and the pixels PX1 and PX2 connected thereto. For convenience of illustration and description, FIG. 2 shows one demultiplexer DM of the demultiplexers DM of FIG. 1, and shows two pixels PX1 and PX2 of the pixels PX connected to the demultiplexer DM.

Referring to FIGS. 1 and 2, the demultiplexer DM may be connected between the output line OL and the data lines DL1 and DL2. The data lines DL1 and DL2 may include a first data line DL1 and a second data line DL2.

In an embodiment, the demultiplexer DM may time-divisionally transmit the data signals, which are received from the data driver DD through the output line OL, to the first data line DL1 and the second data line DL2. In such an embodiment, the first data line DL1 and the second data line DL2 may be connected to the pixels PX1 and PX2 included in one pixel column. In one embodiment, for example, the first data line DL1 may be connected to the first pixel PX1, and the second data line DL2 may be connected to the second pixel PX2 positioned in the first direction DR1 from the first pixel PX1 or adjacent to the first pixel PX1 in the first direction DR1.

The first data line DL1 may be connected to a part of the pixel rows PR, and the second data line DL2 may be connected to the remaining part of pixel rows PR. In one embodiment, for example, the first data line DL1 may be connected to the pixels in odd-numbered pixel rows PRO of the pixel rows PR, and the second data line DL2 may be connected to the pixels in even-numbered pixel rows PRE of the pixel rows PR. In such an embodiment, the first pixel PX1 may be included in the odd-numbered pixel rows PRO of the pixel rows PR, and the second pixel PX2 may be included in the even-numbered pixel rows PRE of the pixel rows PR.

The demultiplexer DM may include a first transistor M1 and a second transistor M2.

The first transistor M1 may be connected between the output line OL and the first data line DL1, and the on-off operation may be controlled by a first driving signal CD1. The second transistor M2 may be connected between the output line OL and the second data line DL2, and the on-off operation may be controlled by a second driving signal CD2. In one embodiment, for example, when the first driving signal CD1 is supplied, the first transistor M1 may be turned on. Accordingly, the data signal of the output line OL may be supplied to the first data line DL1. In such an embodiment, when the second drive signal CD2 is supplied, the second transistor M2 may be turned on. Accordingly, the data signal of the output line OL may be supplied to the second data line DL2.

The first transistor M1 and the second transistor M2 may be turned on independently of each other or at mutually different periods from each other. Accordingly, a supply period of the first driving signal CD1 and a supply period of the second driving signal CD2 may not overlap each other.

Figure 3:
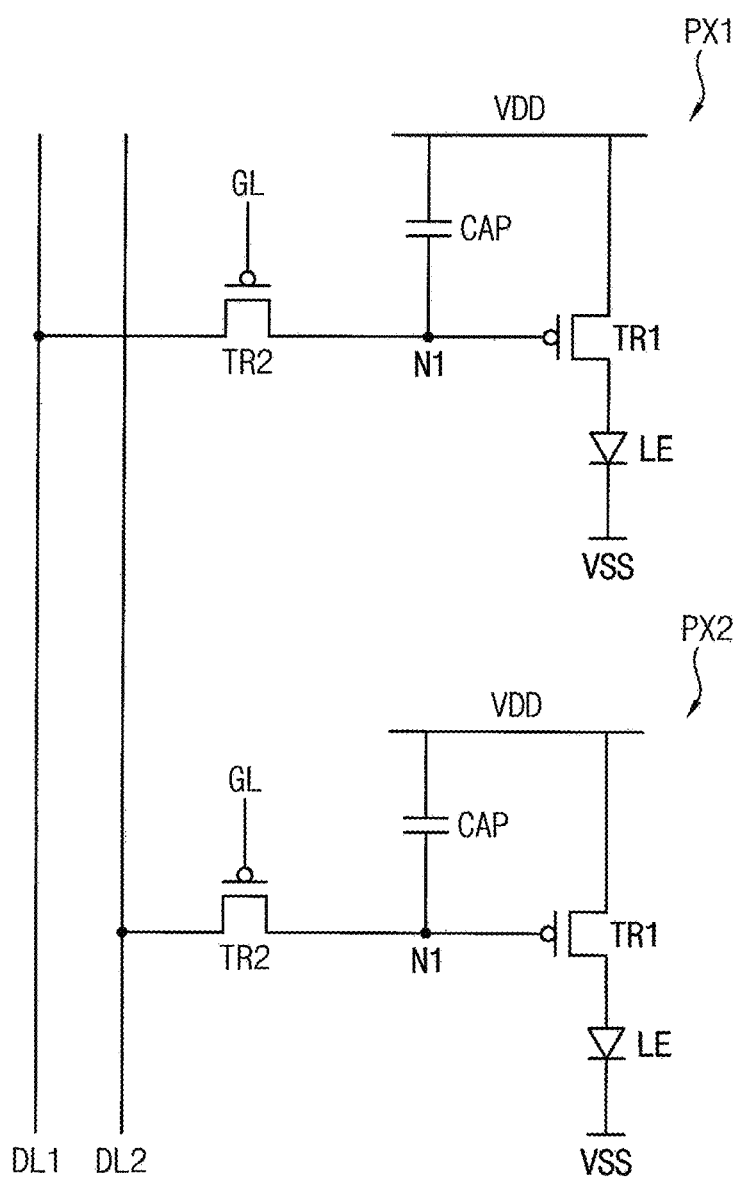
FIG. 3 is a circuit diagram illustrating one example of the first pixel PX1 and the second pixel PX2 shown in FIG. 2.

FIG. 3 is a circuit diagram illustrating an embodiment of the first pixel PX1 and the second pixel PX2 shown in FIG. 2.

Referring to FIG. 3, in an embodiment, each of the first pixel PX1 and the second pixel PX2 may include a light emitting device LE and a pixel circuit.

An anode of the light emitting device LE may be connected to the pixel circuit, and a cathode may be connected to the second power supply VSS. The light emitting device LE may generate light having predetermined luminance in correspondence with an amount of current supplied from the pixel circuit. A voltage of the first power supply VDD supplied to the anode of the light emitting device LE may be greater than a voltage of the second power supply VSS, such that a current flows through the light emitting device LE.

The pixel circuit may control the amount of current flowing from the first power supply VDD to the second power supply VSS via the light emitting device LE in response to the data signal. In an embodiment, as shown in FIG. 3, the pixel circuit may include a first transistor TR1, a second transistor TR2, and a capacitor CAP.

A first electrode of the first transistor TR1 (or a driving transistor) may be connected to the first power supply VDD, and a second electrode of the first transistor TR1 may be connected to the anode of the light emitting device LE. A gate electrode of the first transistor TR1 may be connected to a first node N1. The first transistor TR1 may control the amount of current supplied from the first power supply VDD to the second power supply VSS via the light emitting device LE in response to a voltage stored in the capacitor CAP.

The second transistor TR2 (or a switching transistor) may be connected between the data lines DL1 and DL2 and the first node N1. The second transistor TR2 of the first pixel PX1 may be connected between the first data line DL1 and the first node N1, and the second transistor TR2 of the second pixel PX2 may be connected between the second data line DL2 and the first node N1. A gate electrode of the second transistor TR2 may be connected to the gate line GL. The second transistor TR2 may be turned on when the gate signal is supplied to the gate line GL, thereby providing the data signal to the first node N1. The capacitor CAP may be connected between the first power supply VDD and the first node N1.

The capacitor CAP may store a voltage corresponding to the data signal.

A first electrode of each of the transistors TR1 and TR2 may be one of a source electrode and a drain electrode, and a second electrode of each of the transistors TR1 and TR2 may be the other of the source electrode and the drain electrode. In one embodiment, for example, the first electrode of each of the transistors TR1 and TR2 may be the source electrode, and the second electrode of each of the transistors TR1 and TR2 may be the drain electrode.

Figure 4:
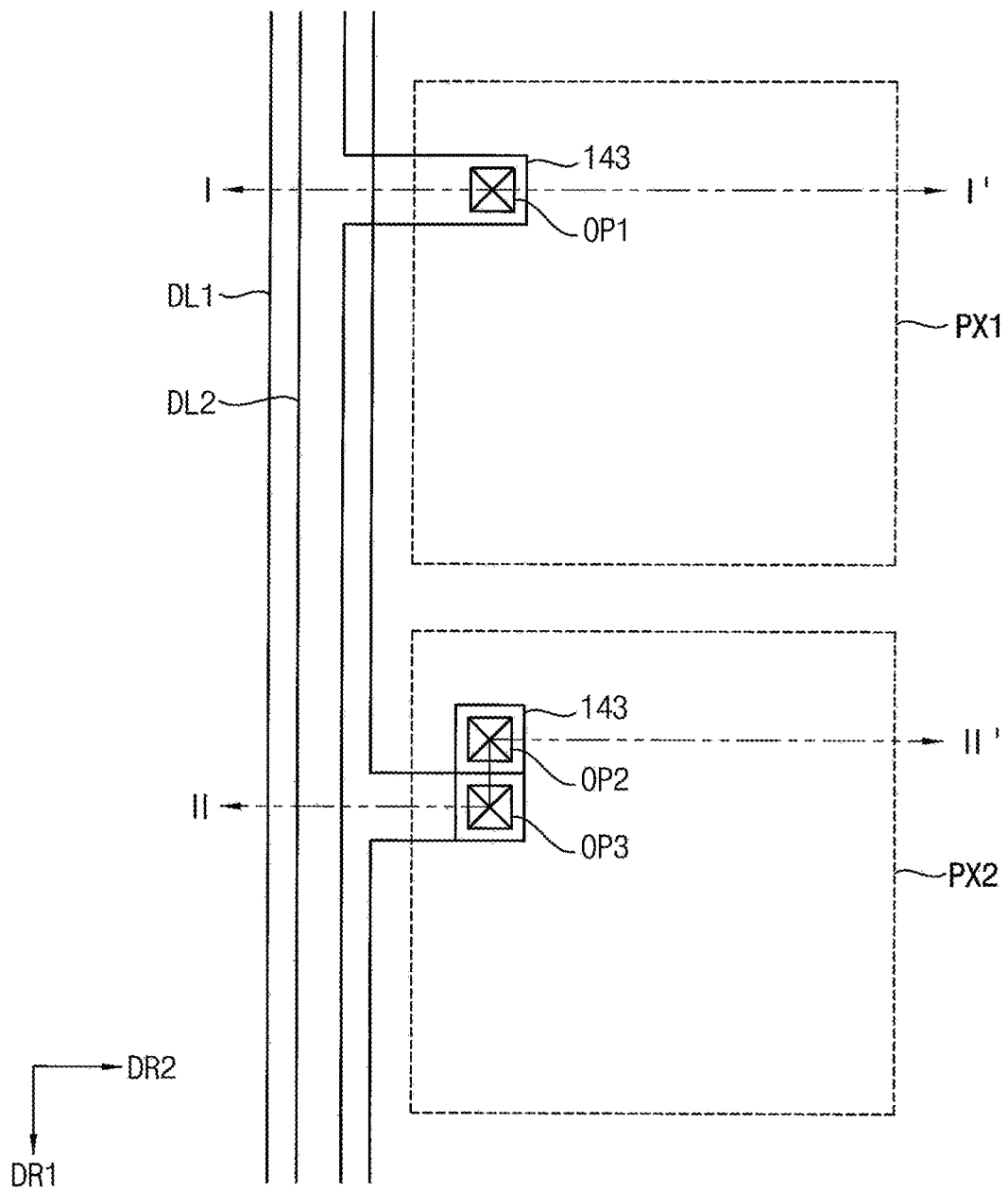
FIG. 4 is a plan view illustrating the display device according to an embodiment of the invention.

FIG. 4 is a plan view illustrating the display device according to an embodiment of the present invention. FIG. 4 illustrate an embodiment of the first pixel PX1 and the second pixel PX2 shown in FIG. 2.

Referring to FIG. 4, in an embodiment, the first data line DL1 may extend in the first direction DR1 and be connected to the first pixel PX1, and the second data line DL2 may extend in the first direction DR1 and be connected to the second pixel PX2. In such an embodiment, the first pixel PX1 may be connected to the first data line DL1, and the second pixel PX2 may be connected to the second data line DL2.

In an embodiment, the first data line DL1 and the second data line DL2 may overlap each other when viewed from a plan view, e.g., a plan view in a thickness direction of the display unit DU. In one embodiment, for example, at least a part of the first data line DL1 may overlap at least a part of the second data line DL2. In such an embodiment, where the first data line DL1 and the second data line DL2 overlap each other, an area in which the data lines DL1 and DL2 are formed in the plan view may be reduced. Accordingly, areas of the first pixel PX1 and the second pixel PX2 may increase.

Figure 5:
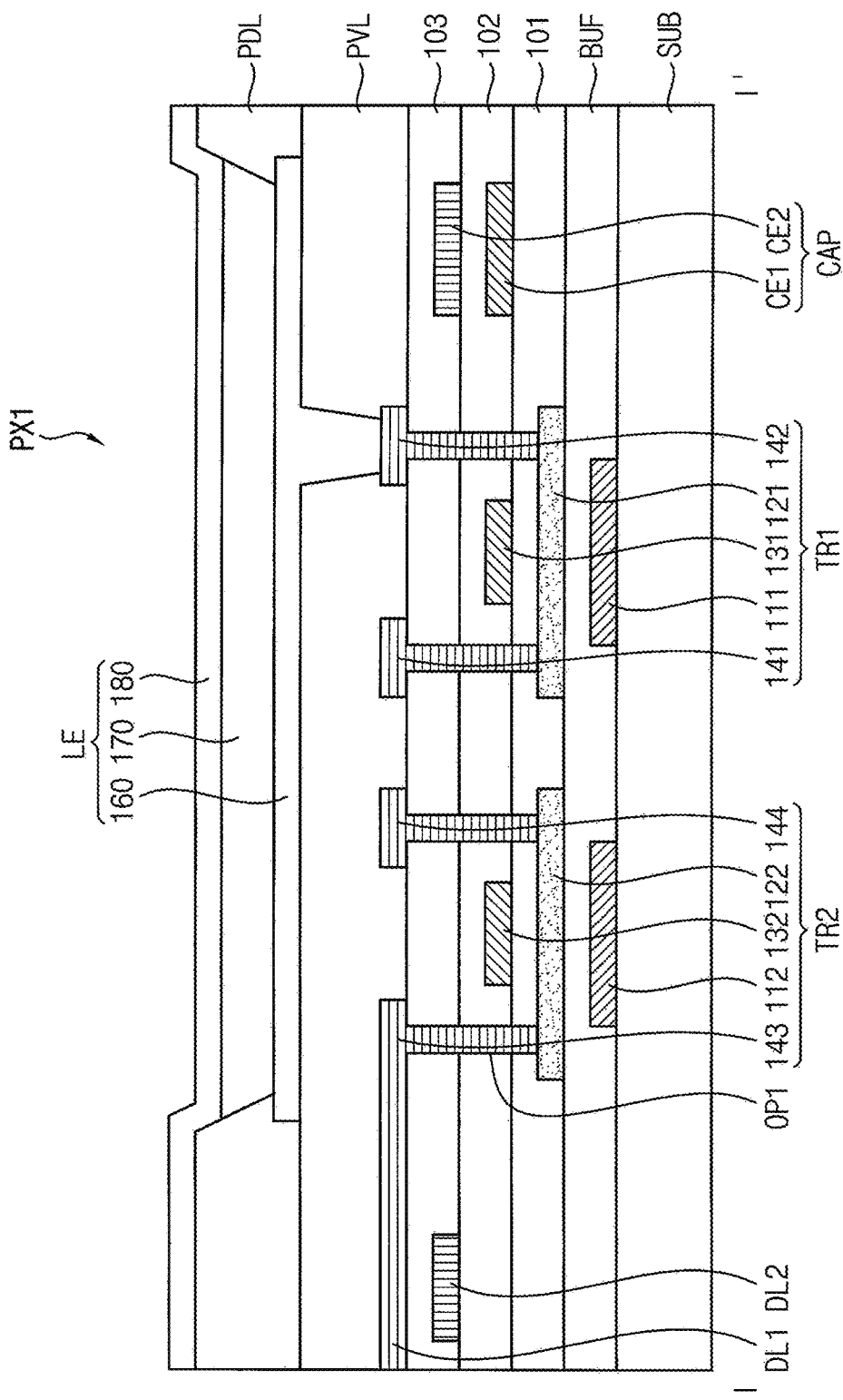
FIG. 5 is a cross-sectional view illustrating an embodiment of the first pixel PX1 taken along line I-I' of FIG. 4.
Figure 6:
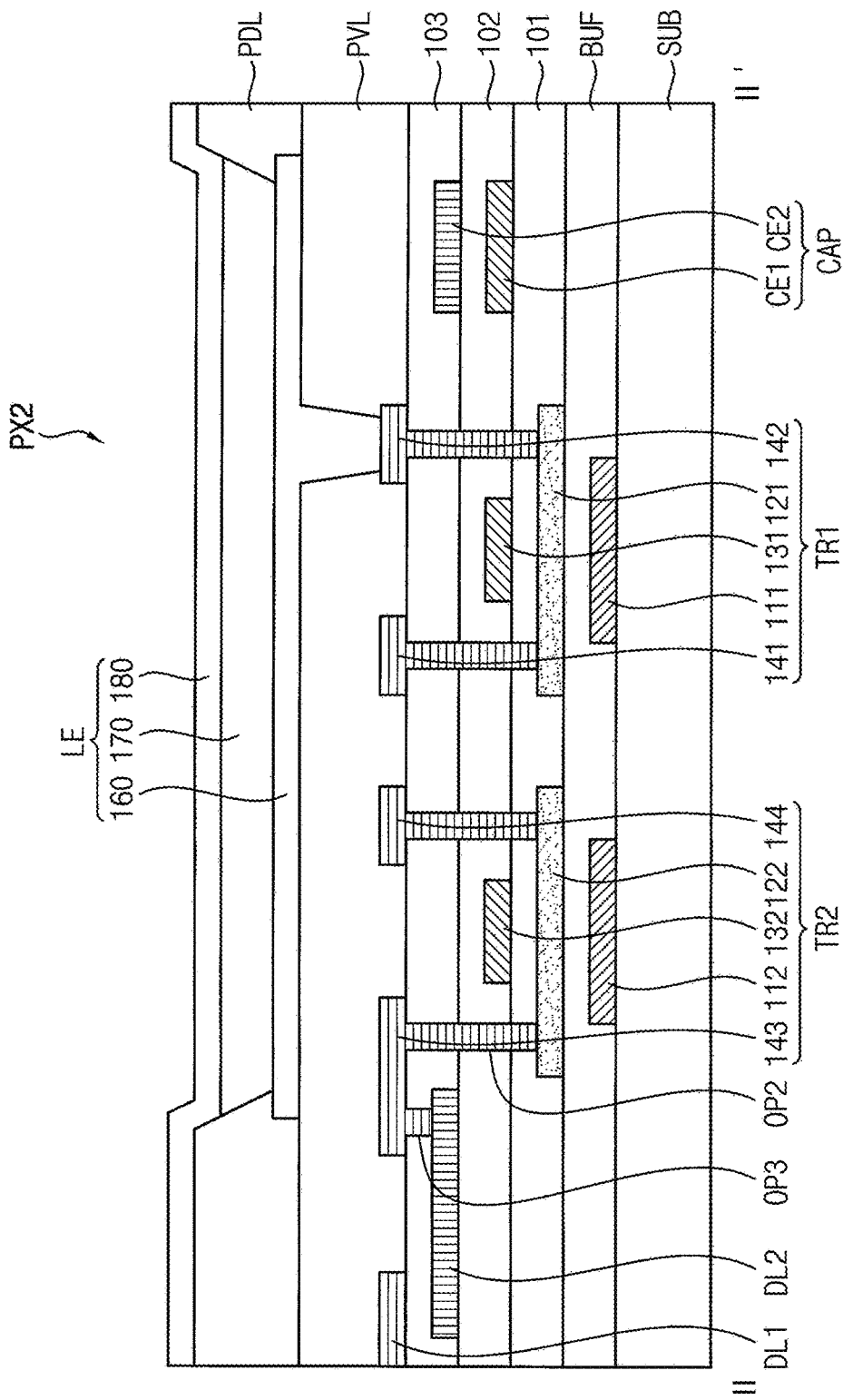
FIG. 6 is a cross-sectional view illustrating an embodiment of the second PX2 taken along line II-II' of FIG. 4.

FIG. 5 is a cross-sectional view illustrating an embodiment of the first pixel PX1 taken along line I-I' of FIG. 4.
FIG. 6 is a cross-sectional view illustrating an embodiment of the second PX2 taken along line II-II' of FIG. 4.

Referring to FIGS. 4, 5 and 6, each of the first pixel PX1 and the second pixel PX2 may include a first transistor TR1, a second transistor TR2, a capacitor CAP, and a light emitting device LE disposed on a substrate SUB. The first transistor TR1 may include a first conductive layer 111, a first semiconductor layer 121, a first gate electrode 131, a first source electrode 141, and a first drain electrode 142. The second transistor TR2 may include a second conductive layer 112, a second semiconductor layer 122, a second gate electrode 132, a second source electrode 143, and a second drain electrode 144. The capacitor CAP may include a first capacitor electrode CE1 and a second capacitor electrode CE2. The light emitting device LE may include a pixel electrode 160, a light emitting layer 170, and a counter electrode 180.

The substrate SUB may be a transparent insulating substrate. In one embodiment, for example, the substrate SUB may include or be formed of a transparent insulating material such as a glass, quartz, a plastic, or the like.

In an embodiment, the first conductive layer 111 and the second conductive layer 112 may be disposed on the substrate SUB. The first conductive layer 111 and the second conductive layer 112 may block external light, impurities, and the like from entering the first semiconductor layer 121 and the second semiconductor layer 122 through the substrate SUB. In such an embodiment, when a voltage is applied to the first conductive layer 111 and the second conductive layer 112, the first conductive layer 111 and the second conductive layer 112 may function as a lower gate electrode of the first transistor TR1 and a lower gate electrode of the second transistor TR2, respectively. In one embodiment, for example, the first conductive layer 111 may be electrically connected to the first source electrode 141 or the first drain electrode 142, and the second conductive layer 112 may be electrically connected to the second gate electrode 132. In such an embodiment, threshold voltages of the first transistor TR1 and the second transistor TR2 may be adjusted, such that hysteresis characteristics of the first transistor TR1 and the second transistor TR2 may be improved.

Each of the first conductive layer 111 and the second conductive layer 112 may include or be formed of a conductive material having a relatively low resistance. In one embodiment, for example, each of the first conductive layer 111 and the second conductive layer 112 may include or be formed of a metal such as aluminum (Al) or copper (Cu).

In an embodiment, a buffer layer BUF may be disposed on the first conductive layer 111 and the second conductive layer 112. The buffer layer BUF may be disposed on the substrate SUB while covering the first conductive layer 111 and the second conductive layer 112. The buffer layer BUF may block impurities from entering through the substrate SUB. In such an embodiment, the buffer layer BUF may provide a flat surface on the substrate SUB. The buffer layer BUF may include an inorganic insulating material. In one embodiment, for example, the buffer layer BUF may include at least one selected from silicon nitride, silicon oxide, and the like.

The first semiconductor layer 121 and the second semiconductor layer 122 may be disposed on the buffer layer BUF. The first semiconductor layer 121 and the second semiconductor layer 122 may overlap the first conductive layer 111 and the second conductive layer 112, respectively.

In an embodiment, each of the first semiconductor layer 121 and the second semiconductor layer 122 may include an amorphous silicon, a polycrystalline silicon, or the like. In an alternative embodiment, each of the first semiconductor layer 121 and the second semiconductor layer 122 may include an oxide semiconductor, a metal oxide, or the like. Each of the first semiconductor layer 121 and the second semiconductor layer 122 may include a source region, a drain region, and a channel region disposed therebetween. The source region and the drain region may be doped with P type or N type impurities, respectively.

A first insulating layer 101 may be disposed on the first semiconductor layer 121 and the second semiconductor layer 122. The first insulating layer 101 may be disposed on the buffer layer BUF while covering the first semiconductor layer 121 and the second semiconductor layer 122. The first insulating layer 101 may include an inorganic insulating material. In one embodiment, for example, the first insulating layer 101 may include silicon nitride, silicon oxide, or the like.

The first gate electrode 131, the second gate electrode 132 and the first capacitor electrode CE1 may be disposed on the first insulating layer 101. The first gate electrode 131 may overlap the channel region of the first semiconductor layer 121, and the second gate electrode 132 may overlap the channel region of the second semiconductor layer 122. The first capacitor electrode CE1 may be spaced apart from the first gate electrode 131 and the second gate electrode 132. Each of the first gate electrode 131, the second gate electrode 132, and the first capacitor electrode CE1 may include or be formed of a conductive material having a relatively large resistance. In one embodiment, for example, each of the first gate electrode 131, the second gate electrode 132 and the first capacitor electrode CE1 may include or be formed of a metal such as molybdenum (Mo).

A second insulating layer 102 may be disposed on the first gate electrode 131, the second gate electrode 132 and the first capacitor electrode CE1. The second insulating layer 102 may be disposed on the first insulating layer 101 while covering the first gate electrode 131, the second gate electrode 132 and the first capacitor electrode CE1. The second insulating layer 102 may include an inorganic insulating material. In one embodiment, for example, the second insulating layer 102 may include silicon nitride, silicon oxide, or the like.

The second capacitor electrode CE2 may be disposed on the second insulating layer 102. The second capacitor electrode CE2 may overlap the first capacitor electrode CE1. The second capacitor electrode CE2 may define or form the capacitor CAP together with the first capacitor electrode CE1.

The second capacitor electrode CE2 may include or be formed of a conductive material having a relatively low resistance. In one embodiment, for example, the second capacitor electrode CE2 may include or be formed of a metal such as aluminum (Al) or copper (Cu).

A third insulating layer 103 may be disposed on the second capacitor electrode CE2. The third insulating layer 103 may be disposed on the second insulating layer 102 while covering the second capacitor electrode CE2. The third insulating layer 103 may include an inorganic insulating material. In one embodiment, for example, the third insulating layer 103 may include silicon nitride, silicon oxide, or the like.

The first source electrode 141, the first drain electrode 142, the second source electrode 143 and the second drain electrode 144 may be disposed on the third insulating layer 103. The first source electrode 141 and the first drain electrode 142 together may be referred to as a first source/drain electrode 141/142, and the second source electrode 143 and the second drain electrode 144 together may be referred to as a second source/drain electrode 143/144.

The first source electrode 141 may be connected to the source region of the first semiconductor layer 121 through contact holes defined or formed in the first insulating layer 101, the second insulating layer 102 and the third insulating layer 103, and the first drain electrode 142 may be connected to the drain region of the first semiconductor layer 121 through contact holes defined or formed in the first insulating layer 101, the second insulating layer 102 and the third insulating layer 103. The second source electrode 143 may be connected to the source region of the second semiconductor layer 122 through contact holes OP1 and OP2 defined or formed in the first insulating layer 101, the second insulating layer 102 and the third insulating layer 103, and the second drain electrode 144 may be connected to the drain region of the second semiconductor layer 122 through contact holes defined or formed in the first insulating layer 101, the second insulating layer 102 and the third insulating layer 103. The first source electrode 141 and the first drain electrode 142 may define or form the first transistor TR1 together with the first conductive layer 111, the first semiconductor layer 121 and the first gate electrode 131. The second source electrode 143 and the second drain electrode 144 may define or form the second transistor TR2 together with the second conductive layer 112, the second semiconductor layer 122 and the second gate electrode 132.

Each of the first source electrode 141, the first drain electrode 142, the second source electrode 143 and the second drain electrode 144 may include or be formed of a conductive material having a relatively low resistance. In one embodiment, for example, each of the first source electrode 141, the first drain electrode 142, the second source electrode 143 and the second drain electrode 144 may include or be formed of a metal such as aluminum (Al), titanium (Ti), or copper (Cu).

A protective layer PVL may be disposed on the first source electrode 141, the first drain electrode 142, the second source electrode 143 and the second drain electrode 144. The protective layer PVL may be disposed on the third insulating layer 103 while covering the first source electrode 141, the first drain electrode 142, the second source electrode 143 and the second drain electrode 144. The protective layer PVL may include an organic insulating material. In one embodiment, for example, the protective layer PVL may include polyimide ("PI") or the like.

The pixel electrode 160 may be disposed on the protective layer PVL. The pixel electrode 160 may be connected to the first source/drain electrode 141/142 through a contact hole defined or formed in the protective layer PVL. In an embodiment, as shown in FIGS. 5 and 6, the pixel electrode 160 may be connected to the first drain electrode 142, but the invention is not limited thereto. In an alternative embodiment, the pixel electrode 160 also may be connected to the first source electrode 141. The pixel electrode 160 may include a conductive material such as metal, an alloy, or a transparent conductive oxide. In one embodiment, for example, the pixel electrode 160 may include silver (Ag), indium tin oxide ("ITO"), or the like.

A pixel defining layer PDL may be disposed on the pixel electrode 160. The pixel defining layer PDL may be disposed on the protective layer PVL while covering the pixel electrode 160. A pixel opening is defined through the pixel defining layer PDL to expose at least a part of the pixel electrode 160. In an embodiment, the pixel opening may expose a central portion of the pixel electrode 160, and the pixel defining layer PDL may cover a peripheral portion of the pixel electrode 160. The pixel defining layer PDL may include an organic insulating material. In one embodiment, for example, the pixel defining layer PDL may include PI or the like.

The light emitting layer 170 may be disposed on the pixel electrode 160. The light emitting layer 170 may be disposed on the pixel electrode 160 exposed by the pixel opening. The light emitting layer 170 may include at least one material selected from an organic light emitting material and a quantum dot.

In an embodiment, the organic light emitting material may include a low molecular organic compound or a high molecular organic compound. In one embodiment, for example, the low molecular organic compound may include copper phthalocyanine, diphenylbenzidine (N, N'-diphenyl-benzidine), trihydroxyquinoline aluminum (tris-(8-hydroxy-quinoline)aluminum), or the like. The high molecular organic compound may include poly ethylenedioxythio-phene (poly(3,4-ethylenedioxythiophene), polyaniline, polyphenylenevinylene, polyfluorene, or the like.

In an embodiment, the quantum dot may include a group II-VI compound, a group III-V compound, a group IV-VI compound, a group IV element, a group IV compound, and a combination thereof. In an embodiment, the quantum dot may have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

The counter electrode 180 may be disposed on the light emitting layer 170. In an embodiment, the counter electrode 180 may also be disposed on the pixel defining layer PDL. The counter electrode 180 may include a conductive material such as a metal, an alloy, or a transparent conductive oxide. In one embodiment, for example, the counter electrode 180 may include aluminum (Al), platinum (Pt), silver (Ag), magnesium (Mg), gold (Au), chromium (Cr), tungsten (W), titanium (Ti) and the like. The pixel electrode 160, the light emitting layer 17, and the counter electrode 180 may collective define or form the light emitting device LE.

In an embodiment, the first data line DL1 may be disposed in a same layer as the first source/drain electrode 141/142 of the first transistor TR1 and the second source/drain electrode 143/144 of the second transistor TR2. Herein, when two elements are disposed in a same layer as each other, the two elements are disposed directly on a same layer as each other. In such an embodiment, the first data line DL1 may be disposed on the third insulating layer 103. In such an embodiment, the first data line DL1 may include a same material as the first source/drain electrode 141/142 of the first transistor TR1 and the second source/drain electrode 143/144 of the second transistor TR2.

The first data line DL1 may be integrated with the second source/drain electrode 143/144 of the second transistor TR2 of the first pixel PX1. In an embodiment, as shown in FIGS. 4 and 5, the first data line DL1 may be integrated with the second source electrode 143 of the second transistor TR2 of the first pixel PX1, but the invention is not limited thereto. In an alternative embodiment, the first data line DL1 may be integrated with the second drain electrode 144 of the second transistor TR2 of the first pixel PX1.

The first data line DL1 may include a protrusion protruding in the second direction DR2 and connected to the first pixel PX1. The protrusion may be connected to the source region of the second semiconductor layer 122 of the second transistor TR2 of the first pixel PX1 through the contact hole OP1. Accordingly, the protrusion may function as the second source electrode 143 of the second transistor TR2 of the first pixel PX1.

In an embodiment, the second data line DL2 may be disposed in a same layer as the second capacitor electrode CE2 of the capacitor CAP. In such an embodiment, the second data line DL2 may be disposed on the second insulating layer 102. In such an embodiment, the second data line DL2 may include a same material as the second capacitor electrode CE2 of the capacitor CAP.

The second data line DL2 may be connected to the second source/drain electrode 143/144 of the second transistor TR2 of the second pixel PX2 through a contact hole OP3 defined in the third insulating layer 103. In an embodiment, as shown in FIGS. 4 and 6, the second data line DL2 may be connected to the second source electrode 143 of the second transistor TR2 of the second pixel PX2 through the contact hole OP3, but the invention is not limited thereto. In an alternative embodiment, the second data line DL2 also may be connected to the second drain electrode 144 of the second transistor TR2 of the second pixel PX2 through the contact hole OP3.

The second data line DL2 may include a protrusion protruding in the second direction DR2 and connected to the second pixel PX2. The protrusion may be connected to the second source electrode 143 of the second transistor TR2 of the second pixel PX1 through the contact hole OP3.

In an embodiment, the second data line DL2 may include a material having an electrical resistance lower than those of the first gate electrode 131, the second gate electrode 132 and the first capacitor electrode CE1. In one embodiment, for example, the second data line DL2 may include or be formed of aluminum (Al), copper (Cu), or the like. In such an embodiment, the second capacitor electrode CE2 and the second data line DL2 may include a material having a relatively low electrical resistance.

In a case, where the second data line DL2 include or is formed of a material having a relatively large electrical resistance (such as molybdenum (Mo)) included in the first gate electrode 131, the second gate electrode 132 and the first capacitor electrode CE1, the transmission of the data signal through the second data line DL2 may be delayed. However, in an embodiment of the invention, the second data line DL2 may include a material having a relatively low electrical resistance such as aluminum (Al) or copper (Cu), such that the transmission of the data signal may be effectively prevented from being delayed due to the electrical resistance of the second data line DL2.

In such an embodiment, the second data line DL2 for high speed driving of the display device is disposed in a same layer as the second capacitor electrode CE2, such that the second data line DL2 may be formed during a process of forming the second capacitor electrode CE2 without forming additional conductive and insulating layers. Accordingly, the number of mask processes during manufacturing the display device may be reduced.

Figure 7:
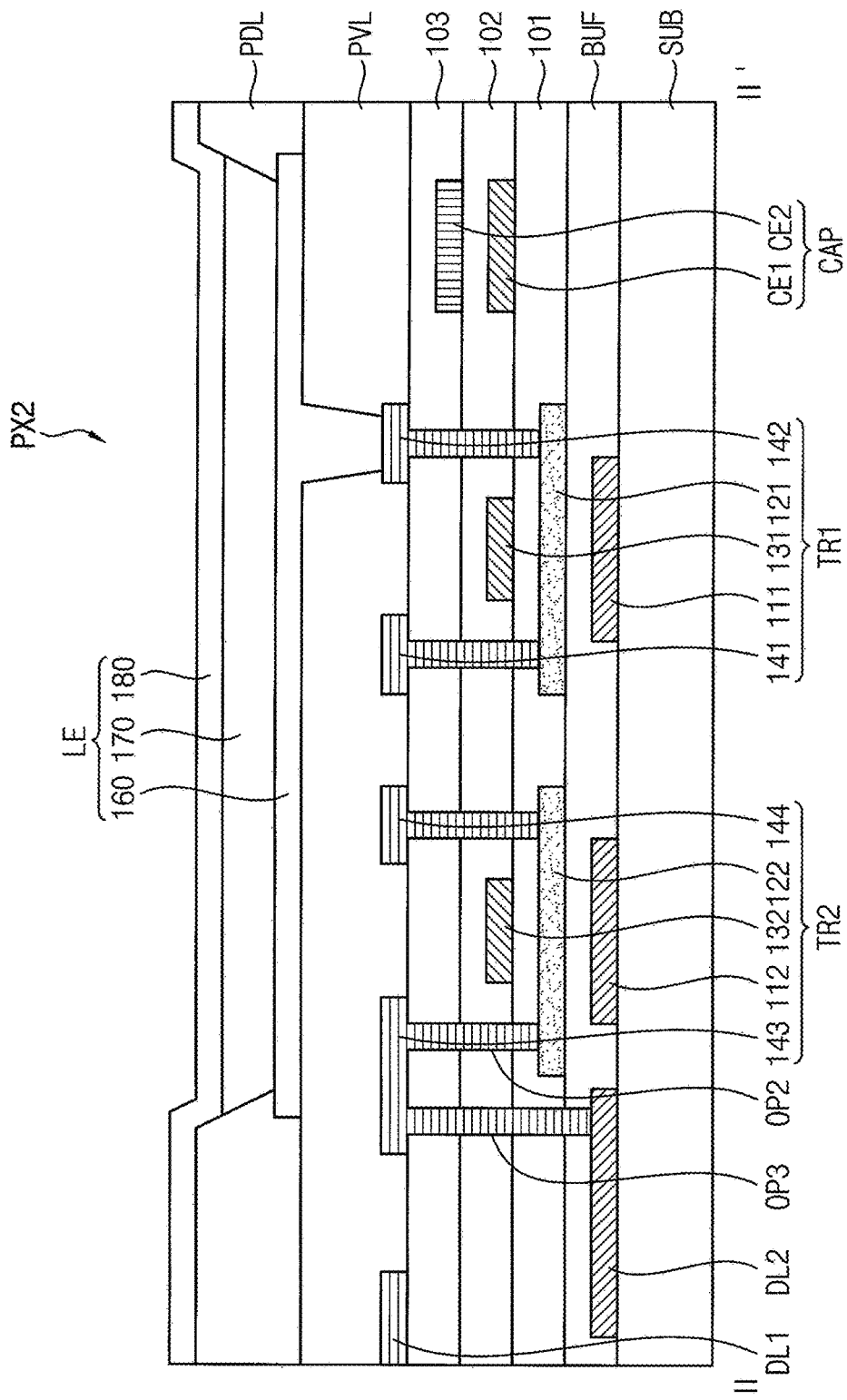
FIG. 7 is a cross-sectional view illustrating an example of the second PX2 taken along line II-II' of FIG. 4.

FIG. 7 is a cross-sectional view illustrating an alternative embodiment of the second PX2 taken along line II-II' of FIG. 4.

An embodiment of the display device shown in FIG. 7 may be substantially the same as the embodiments of the display device described above with reference to FIGS. 5 and 6, except for the position of the second data line DL2. The same or like elements shown in FIG. 7 have been labeled with the same reference characters as used above to describe the embodiments shown in FIGS. 5 and 6, and any repetitive detailed description thereof will hereinafter be omitted or simplified.

Referring to FIGS. 4 and 7, in an embodiment, the second data line DL2 may be disposed in a same layer as the first conductive layer 111 of the first transistor TR1 and the second conductive layer 112 of the second transistor TR2. In such an embodiment, the second data line DL2 may be disposed on the substrate SUB. In such an embodiment, the second data line DL2 may include a same material as the first conductive layer 111 of the first transistor TR1 and the second conductive layer 112 of the second transistor TR2.

The second data line DL2 may be connected to the second source/drain electrode 143/144 of the second transistor TR2 of the second pixel PX2 through the contact hole OP3 defined in the buffer layer BUF, the first insulating layer 101, the second insulating layer 102 and the third insulating layer 103. In an embodiment, as shown in FIGS. 4 and 7, the second data line DL2 may be connected to the second source electrode 143 of the second transistor TR2 of the second pixel PX2 through the contact hole OP3, but the invention is not limited thereto. In an alternative embodiment, the second data line DL2 also may be connected to the second drain electrode 144 of the second transistor TR2 of the second pixel PX2 through the contact hole OP3.

In the process of forming the contact hole OP3 by etching the buffer layer BUF, the first insulating layer 101, the second insulating layer 102 and the third insulating layer 103, there is a risk in which the source region and the drain region of the first semiconductor layer 121 and the source region and the drain region of the second semiconductor layer 122 exposed by the contact holes may be etched together. However, when the contact holes are formed using etching gas such as SF6 or CF4 in which an etching rate with respect to an inorganic insulating layer is larger than an etching rate with respect to a semiconductor layer, the source region and the drain region of the first semiconductor layer 121 and the source region and the drain region of the second semiconductor layer 122 may be effectively prevented from being damaged in the process of forming the contact hole OP3.

In an embodiment, the second data line DL2 may include a material having an electrical resistance lower than those of the first gate electrode 131, the second gate electrode 132 and the first capacitor electrode CE1. In one embodiment, for example, the second data line DL2 may be formed of aluminum (Al), copper (Cu), or the like. In such an embodiment, the first conductive layer 111, the second conductive layer 112 and the second data line DL2 may include a material having a relatively low electrical resistance.

In such an embodiment, the second data line DL2 for high speed driving of the display device is disposed in a same layer as the first conductive layer 111 and the second conductive layer 112, such that the second data line DL2 may be formed during a process of forming the first conductive layer 111 and the second conductive layer 112 without forming additional conductive and insulating layers. Accordingly, the number of mask processes during manufacturing the display device may be reduced.

Figure 8:
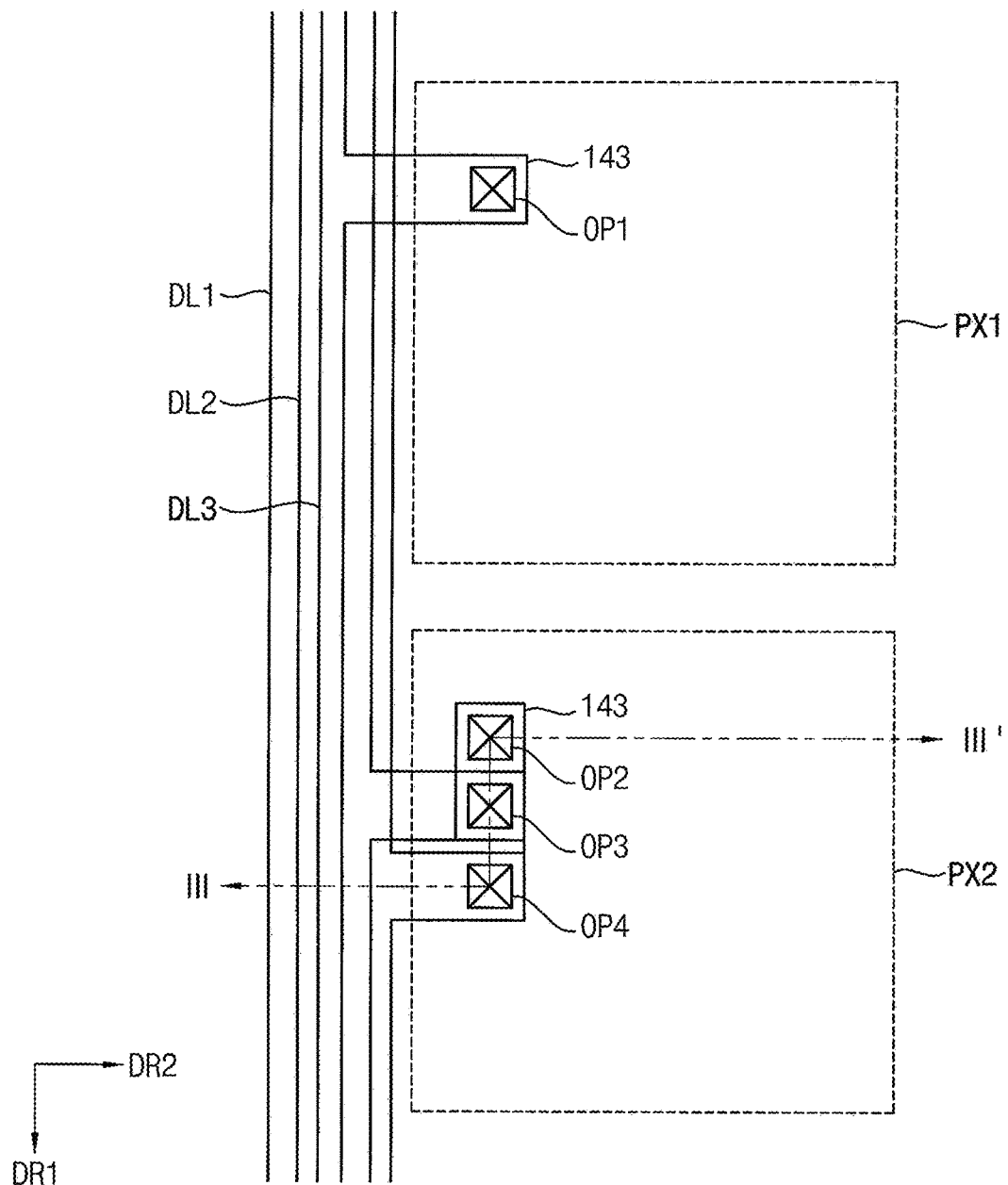
FIG. 8 is a plan view illustrating the display device according to an alternative embodiment of the invention.
Figure 9:
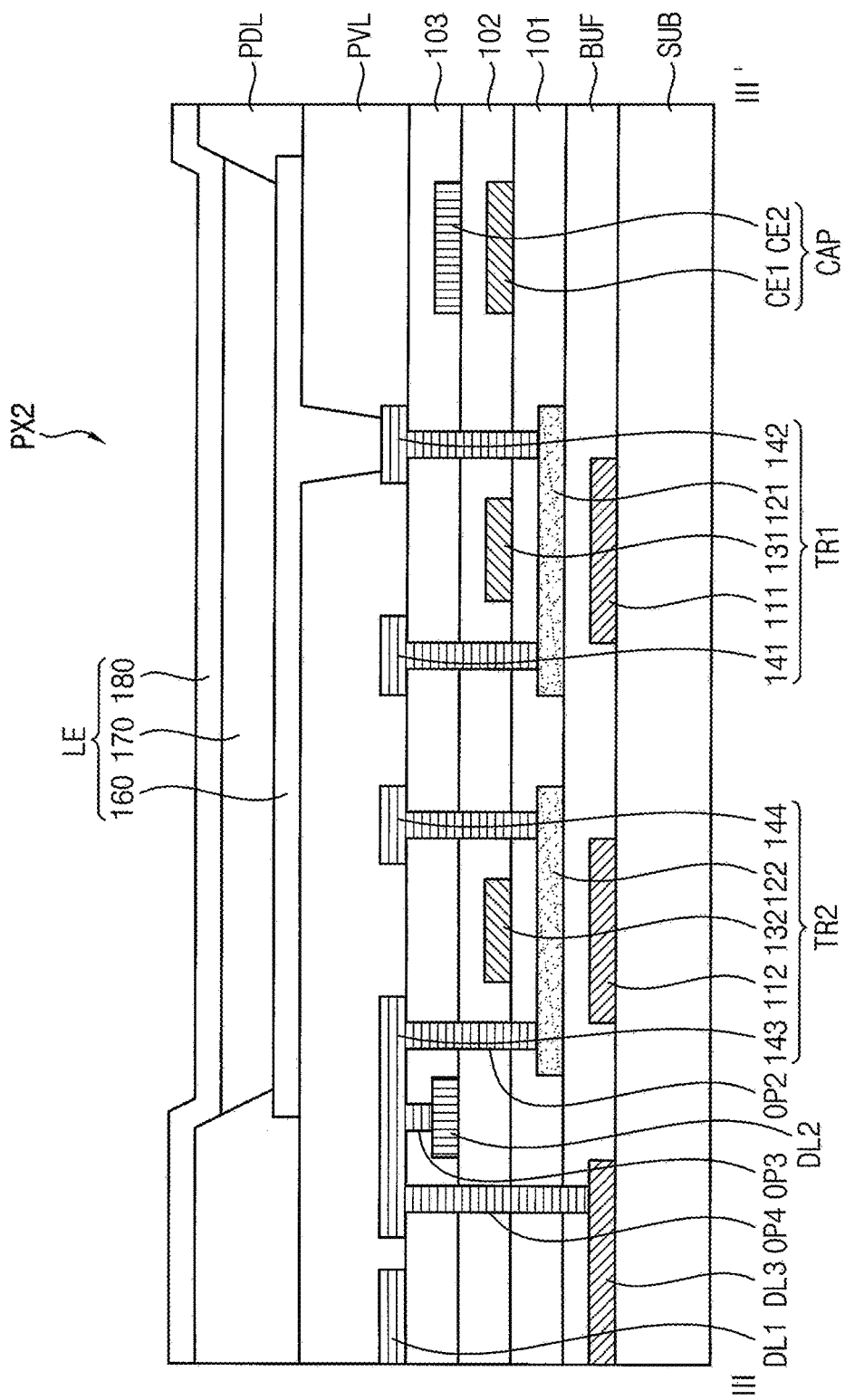
FIG. 9 is a cross-sectional view illustrating an embodiment of the second pixel PX2 taken along line III-III' of FIG. 8.

FIG. 8 is a plan view illustrating the display device according to an alternative embodiment of the invention. FIG. 9 is a sectional view illustrating an embodiment of the second pixel PX2 taken along line III-III' of FIG. 8.

An embodiment of the display device shown in FIGS. 8 and 9 may be substantially the same as the embodiments of the display device described above with reference to FIGS.

4, 5, and 6, except for the addition of the third data line DL3. The same or like elements shown in FIGS. 8 and 9 have been labeled with the same reference characters as used above to describe the embodiments shown in FIGS. 4, 5 and 6, and any repetitive detailed description thereof will hereinafter be omitted or simplified.

Referring to FIG. 8, in an embodiment, the first data line DL1 may extend in the first direction DR1 and be connected to the first pixel PX1, the second data line DL2 may extend in the first direction DR1 and be connected to the second pixel PX2, and the third data line DL3 may extend in the first direction DR1 and be connected to the second pixel PX2. In such an embodiment, the first pixel PX1 may be connected to the first data line DL1, and the second pixel PX2 may be connected to the second data line DL2 and the third data line DL3.

In an embodiment, the first data line DL1, the second data line DL2, and the third data line DL3 may overlap each other when viewed from a plan view. In one embodiment, for example, at least a part of the first data line DL1 may overlap at least a part of the second data line DL2 and at least a part of the third data line DL3, and at least a part of the second data line DL2 may overlap at least a part of the third data line DL3. In such an embodiment where the first data line DL1, the second data line DL2, and the third data line DL3 overlap each other, an area in which the data lines DL1, DL2 and DL3 are formed in the plan view may be reduced. Accordingly, areas of the first pixel PX1 and the second pixel PX2 may increase.

Referring to FIG. 9, the third data line DL3 may be disposed in a same layer as the first conductive layer 111 of the first transistor TR1 and the second conductive layer 112 of the second transistor TR2. In such an embodiment, the third data line DL3 may be disposed on the substrate SUB. In such an embodiment, the third data line DL3 may include a same material as the first conductive layer 111 of the first transistor TR1 and the second conductive layer 112 of the second transistor TR2.

The third data line DL3 may be connected to the second source/drain electrode 143/144 of the second transistor TR2 of the second pixel PX2 through a contact hole OP4 defined in the buffer layer BUF, the first insulating layer 101, the second insulating layer 102 and the third insulating layer 103. In an embodiment, as shown in FIGS. 8 and 9, the third data line DL3 may be connected to the second source electrode 143 of the second transistor TR2 of the second pixel PX2 through the contact hole OP4, but the invention is not limited thereto. In an alternative embodiment, the third data line DL3 also may be connected to the second drain electrode 144 of the second transistor TR2 of the second pixel PX2 through the contact hole OP4.

In an embodiment, the third data line DL3 may include a material having an electrical resistance lower than those of the first gate electrode 131, the second gate electrode 132 and the first capacitor electrode CE1. In one embodiment, for example, the third data line DL3 may include or be formed of aluminum (Al), copper (Cu), or the like. In such an embodiment, the first conductive layer 111, the second conductive layer 112 and the third data line DL3 may include a material having a relatively low electrical resistance.

In an embodiment, the second data line DL2 and the third data line DL3 are electrically connected to each other, such that the electrical resistance of the data line for transmitting the data signal applied to the second pixel PX2 may be reduced. Accordingly, the second data line DL2 and the third data line DL3 may effectively prevent the transmission of the data signal applied to the second pixel PX2 from being delayed.

Figure 10:
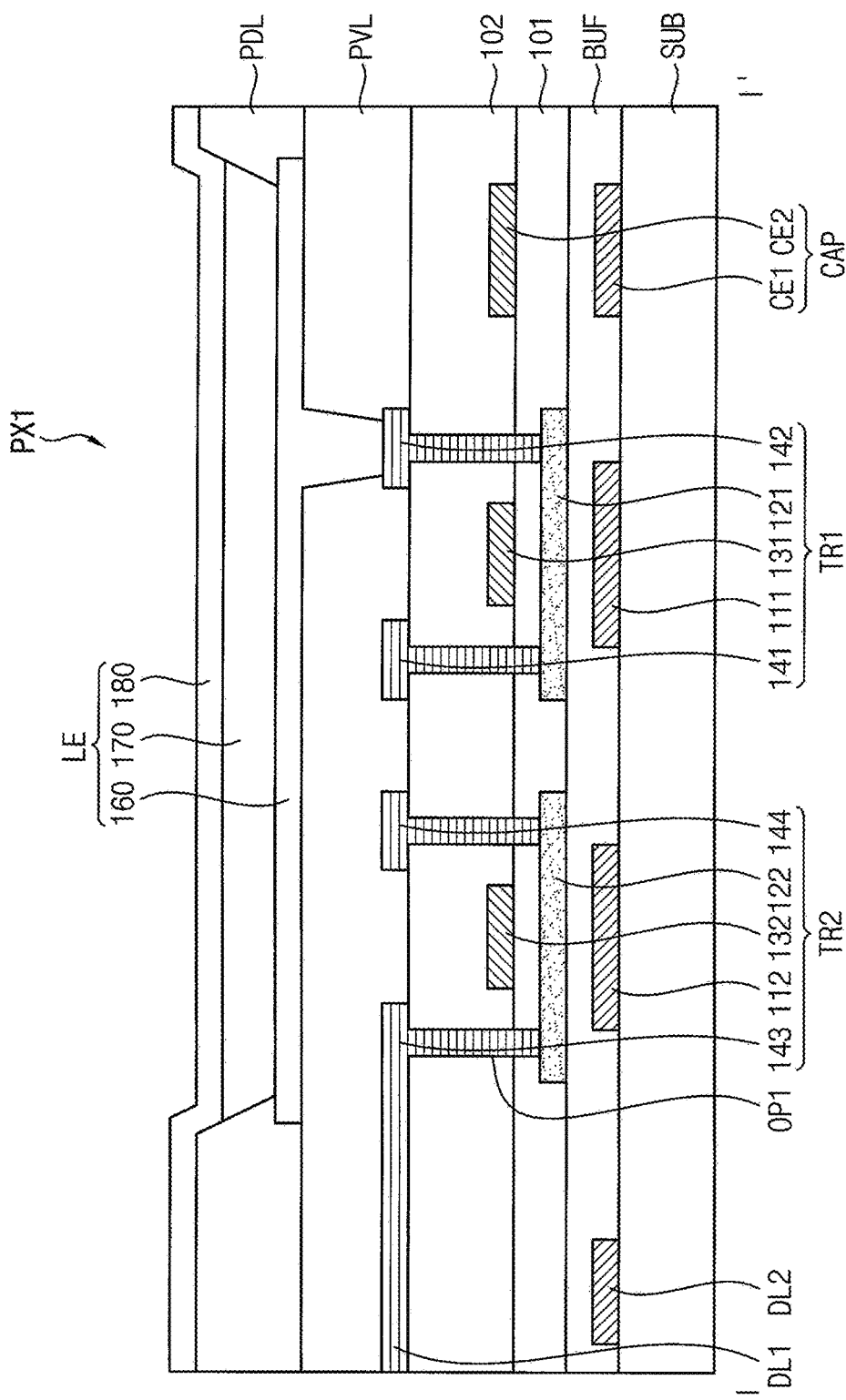
FIG. 10 is a cross-sectional view illustrating an alternative embodiment of the first pixel PX1 taken along line I-I' of FIG. 4.
Figure 11:
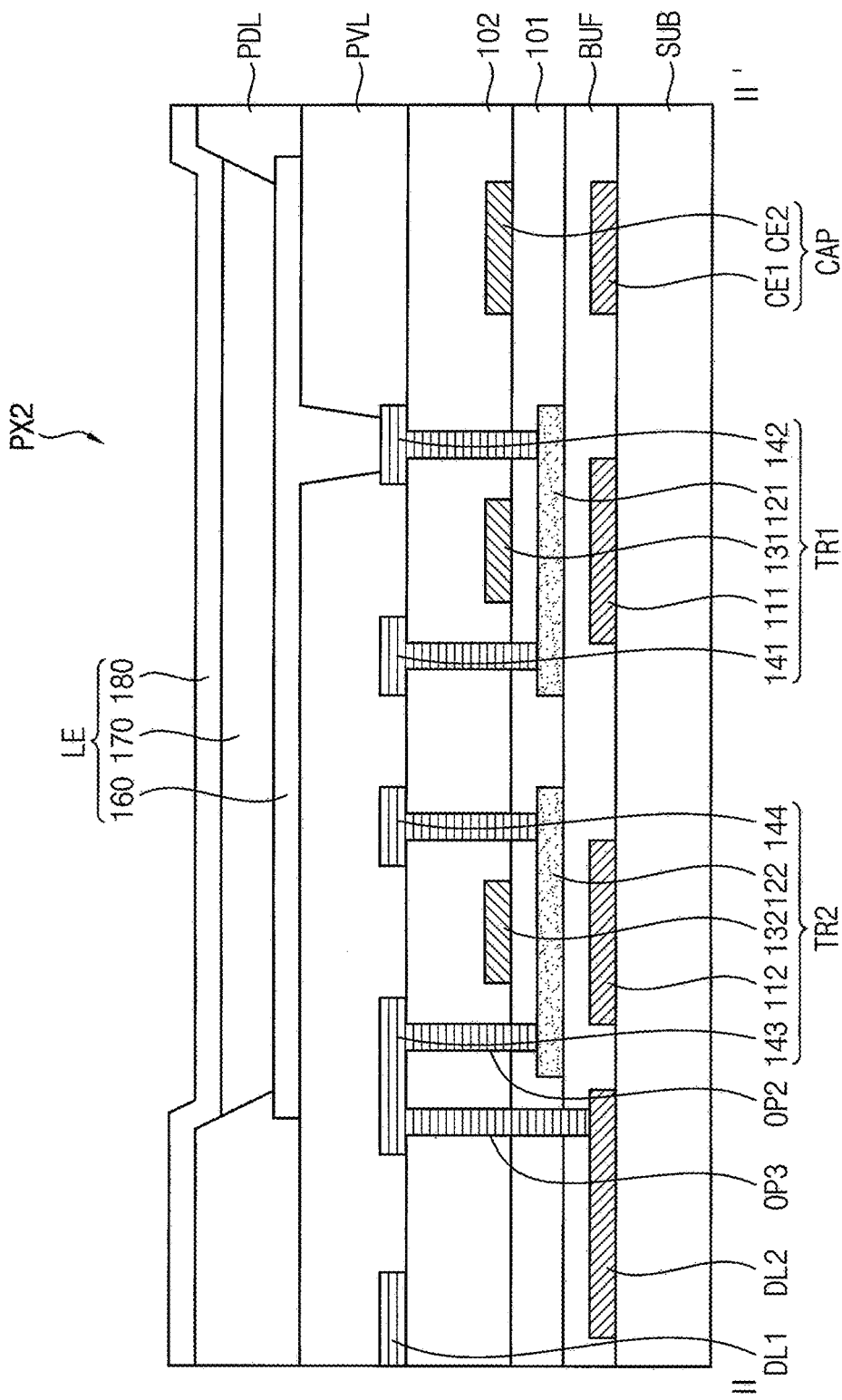
FIG. 11 is a cross-sectional view illustrating an alternative embodiment of the second PX2 taken along line II-II' of FIG. 4.

FIG. 10 is a cross-sectional view illustrating an alternative embodiment of the first pixel PX1 taken along line I-I' of FIG. 4. FIG. 11 is a cross-sectional view illustrating an alternative embodiment of the second PX2 taken along line II-II' of FIG. 4.

An embodiment of the display device shown in FIGS. 10 and 11 may be substantially the same as the embodiments of the display device described above with reference to FIG. 7, except for the position of the first capacitor electrode CE1, the position of the second capacitor electrode CE2 and the omission of the third insulating layer 103. The same or like elements shown in FIGS. 10 and 11 have been labeled with the same reference characters as used above to describe the embodiments shown in FIG. 7, and any repetitive detailed description thereof will hereinafter be omitted or simplified.

Referring to FIGS. 4, 10 and 11, in an embodiment, the first conductive layer 111, the second conductive layer 112 and the first capacitor electrode CE1 may be disposed on the substrate SUB. The first capacitor electrode CE1 may include a same material as the first conductive layer 111 and the second conductive layer 112.

The buffer layer BUF may be disposed on the first conductive layer 111, the second conductive layer 112 and the first capacitor electrode CE1. The buffer layer BUF may be disposed on the substrate SUB while covering the first conductive layer 111, the second conductive layer 112 and the first capacitor electrode CE1.

The first gate electrode 131, the second gate electrode 132 and the second capacitor electrode CE2 may be disposed on the first insulating layer 101. The second capacitor electrode CE2 may include a same material as the first gate electrode 131 and the second gate electrode 132. The second insulating layer 102 may be disposed on the first gate electrode 131, the second gate electrode 132 and the second capacitor electrode CE2. The second insulating layer 102 may be disposed on the first insulating layer 101 while covering the first gate electrode 131, the second gate electrode 132 and the second capacitor electrode CE2.

The first source electrode 141, the first drain electrode 142, the second source electrode 143 and the second drain electrode 144 may be disposed on the second insulating layer 102.

In such an embodiment, the first capacitor electrode CE1 is disposed in a same layer as the first conductive layer 111 and the second conductive layer 112, and the second capacitor electrode CE2 is disposed in a same layer as the first gate electrode 131 and the second gate electrode 132, such that the capacitor electrode of the capacitor CAP may be formed during a process of forming the first conductive layer 111 and the second conductive layer 112 or the first gate electrode 131 and the second gate electrode 132 without forming additional conductive and insulating layers. Accordingly, the number of mask processes during manufacturing the display device may be reduced.

Figure 12:
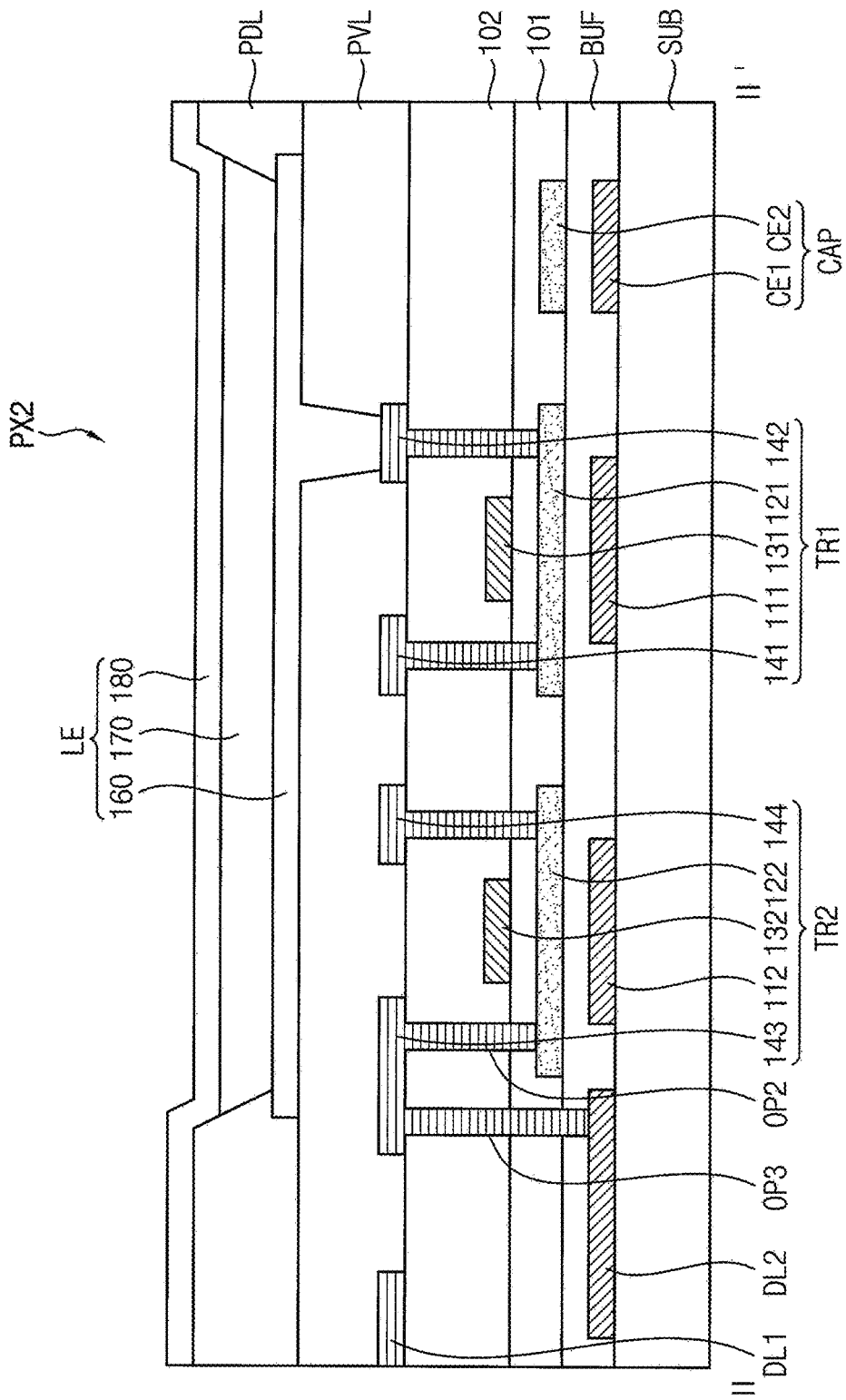
FIG. 12 is a cross-sectional view illustrating another alternative embodiment of the second PX2 taken along line II-II' of FIG. 4.

FIG. 12 is a cross-sectional view illustrating another alternative embodiment of the second PX2 taken along line II-II' of FIG. 4.

An embodiment of the display device shown in FIG. 12 may be substantially the same as the embodiments of the display device described above with reference to FIGS. 10 and 11, except for the position of the first capacitor electrode CE1. The same or like elements shown in FIG. 12 have been labeled with the same reference characters as used above to describe the embodiments shown in FIGS. 10 and 11, and any repetitive detailed description thereof will hereinafter be omitted or simplified.

Referring to FIG. 12, in an embodiment, the first semiconductor layer 121, the second semiconductor layer 122 and the second capacitor electrode CE2 may be disposed on the buffer layer BUF. The second capacitor electrode CE2 may include a same material as the first semiconductor layer 121 and the second semiconductor layer 122. The second capacitor electrode CE2 may be doped with P type or N type impurities, respectively, as the source region and the drain region of each of the first semiconductor layer 121 and the second semiconductor layer 122. Accordingly, the second capacitor electrode CE2 may have electrical conductivity.

The first insulating layer 101 may be disposed on the first semiconductor layer 121, the second semiconductor layer 122 and the second capacitor electrode CE2. The first insulating layer 101 may be disposed on the buffer layer BUF while covering the first semiconductor layer 121, the second semiconductor layer 122 and the capacitor electrode CE2.

The first gate electrode 131 and the second gate electrode 132 may be disposed on the first insulating layer 101.

In such an embodiment, the second capacitor electrode CE2 is disposed in a same layer as the first semiconductor layer 121 and the second semiconductor layer 122, the capacitor electrode of the capacitor CAP may be formed during a process of forming the first semiconductor layer 121 and the second semiconductor layer 122 without forming additional conductive and insulating layers. Accordingly, the number of mask processes during manufacturing the display device may be reduced.

Figure 13:
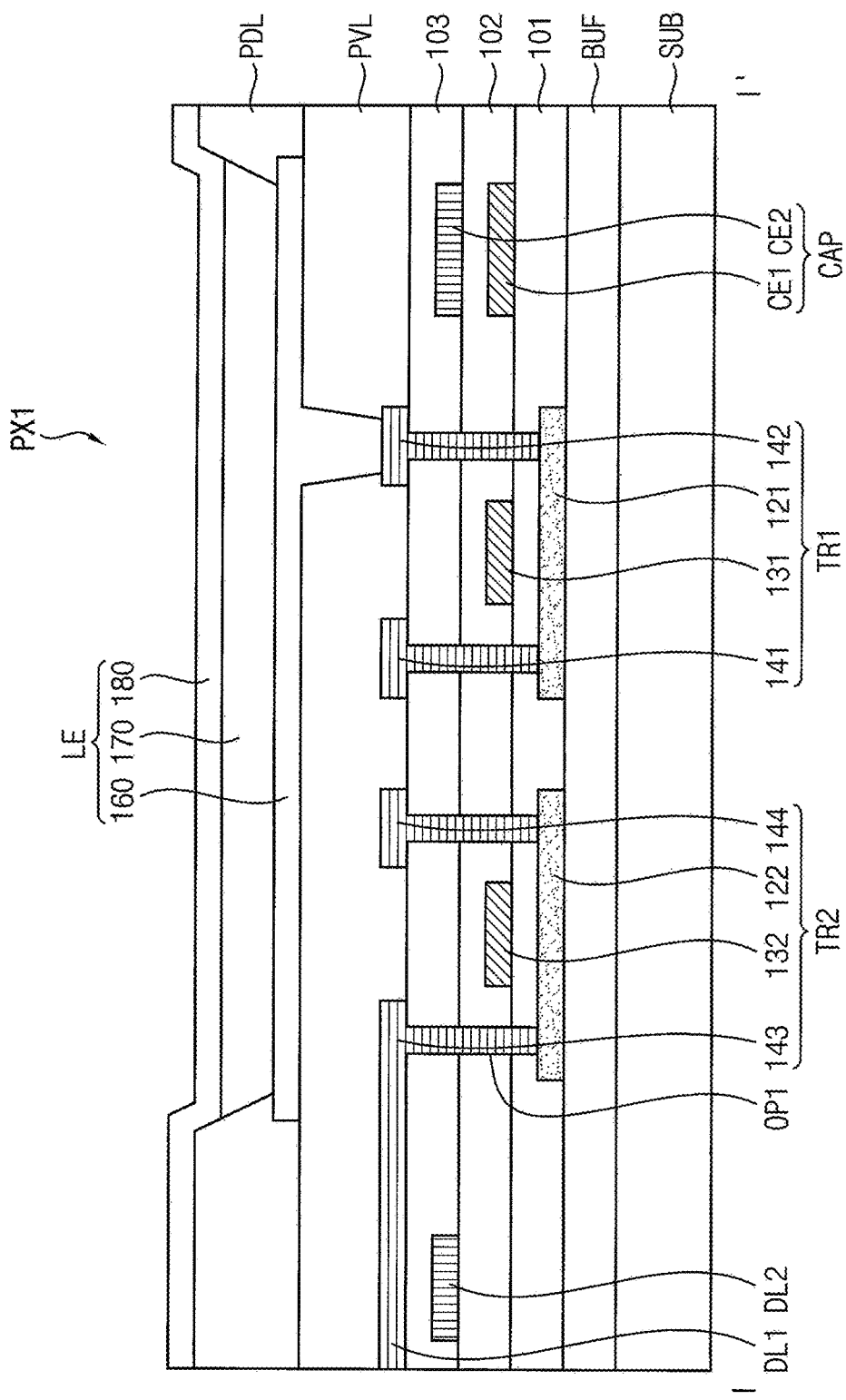
FIG. 13 is a cross-sectional view illustrating another alternative embodiment of the first pixel PX1 taken along line I-I' of FIG. 4.
Figure 14:
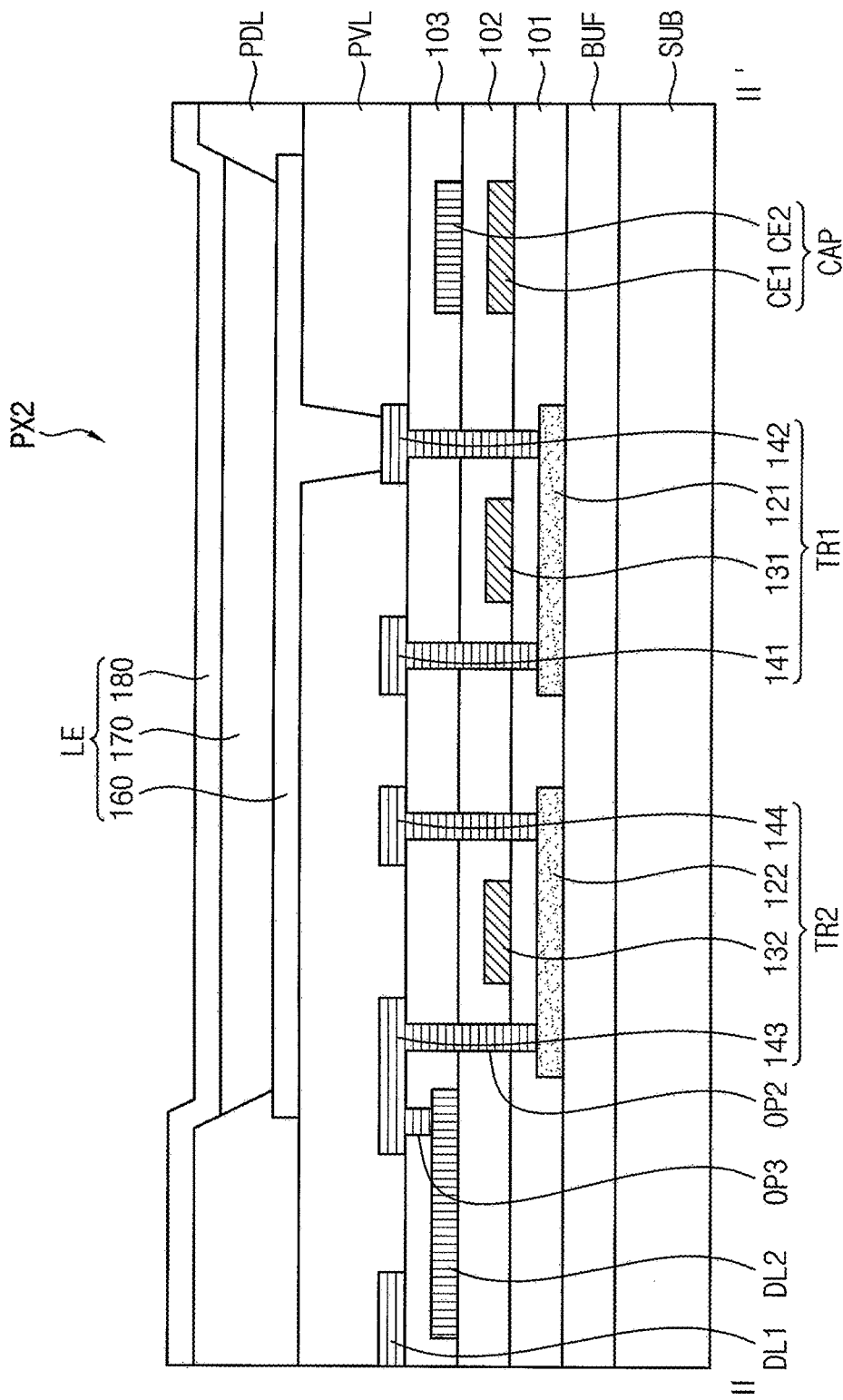
FIG. 14 is a cross-sectional view illustrating another alternative embodiment of the second PX2 taken along line II-II' of FIG. 4.

FIG. 13 is a cross-sectional view illustrating another alternative embodiment of the first pixel PX1 taken along line I-I' of FIG. 4. FIG. 14 is a cross-sectional view illustrating another alternative embodiment of the second PX2 taken along line II-II' of FIG. 4.

An embodiment of the display device shown in FIGS. 13 and 14 may be substantially the same as the embodiments of the display device described above with reference to FIGS. 5 and 6, except for the omissions of the first conductive layer 111 and the second conductive layer 112. The same or like elements shown in FIGS. 13 and 14 have been labeled with the same reference characters as used above to describe the embodiments shown in FIGS. 5 and 6, and any repetitive detailed description thereof will hereinafter be omitted or simplified.

Referring to FIGS. 4, 13 and 14, in an embodiment, each of the first pixel PX1 and the second pixel PX2 may include a first transistor TR1, a second transistor TR2, a capacitor CAP, and a light emitting device LE disposed on a substrate SUB. The first transistor TR1 may include the first semiconductor layer 121, the first gate electrode 131, the first source electrode 141 and the first drain electrode 142. The second transistor TR2 may include the second semiconductor layer 122, the second gate electrode 132, the second source electrode 143 and the second drain electrode 144.

In such an embodiment, the first conductive layer 111 and the second conductive layer 112 are omitted, the formation of an conductive layer for forming the lower gate electrode of each of the first transistor TR1 and the second transistor TR2 may be omitted. Accordingly, the number of mask processes during manufacturing the display device may be reduced. In such an embodiment, where the first conductive layer 111 and the second conductive layer 112 are omitted, the buffer layer BUF, which is configured to insulate the first semiconductor layer 121 and the second semiconductor layer 122 from the first conductive layer 111 and the second conductive layer 112, may be omitted.

Embodiments of The display device set forth herein may be applied to a display device included in a computer, a laptop computer, a mobile phone, a smartphone, a smart pad, a portable media player ("PMP"), a personal digital assistant ("PDA"), an MP3 player, or the like.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:
1. A display device comprising:
a first pixel;
a second pixel adjacent to the first pixel in a predetermined direction;
a first data line extending in the predetermined direction and connected to the first pixel; and
a second data line extending in the predetermined direction and connected to the second pixel, wherein
each of the first pixel and the second pixel includes:
a transistor including a conductive layer, a semiconductor layer disposed on the conductive layer, a gate electrode disposed on the semiconductor layer, and a source/drain electrode connected to the semiconductor layer;
a capacitor including a first capacitor electrode disposed in a same layer as the gate electrode and a second capacitor electrode disposed on the first capacitor electrode; and
a light emitting device disposed on the transistor and the capacitor, and wherein
the first data line is disposed in a same layer as the source/drain electrode, and
the second data line is disposed in a same layer as one of the conductive layer and the second capacitor electrode.

2. The display device of claim 1, wherein the first data line is integrally formed with the source/drain electrode of the transistor of the first pixel.

3. The display device of claim 1, wherein the first data line and the second data line overlap each other when viewed in a plan view.

4. The display device of claim 1, further comprising:
a buffer layer disposed between the conductive layer and the semiconductor layer;
a first insulating layer disposed between the semiconductor layer and the gate electrode;
a second insulating layer disposed between the first capacitor electrode and the second capacitor electrode; and
a third insulating layer disposed between the second capacitor electrode and the source/drain electrode.

5. The display device of claim 4, wherein
the second data line is disposed in a same layer as the second capacitor electrode, and
the second data line is connected to the source/drain electrode of the transistor of the second pixel through a contact hole defined through the third insulating layer.

6. The display device of claim 4, wherein
the second data line is disposed in a same layer as the conductive layer, and
the second data line is connected to the source/drain electrode of the transistor of the second pixel through a contact hole defined through the buffer layer, the first insulating layer, the second insulating layer and the third insulating layer.

7. The display device of claim 4, further comprising:
a third data line extending in the predetermined direction and connected to the second pixel,
wherein
the second data line is disposed in a same layer as the second capacitor electrode, and
the third data line is disposed in a same layer as the conductive layer.

8. The display device of claim 7, wherein the first data line, the second data line, and the third data line overlap each other when viewed in a plan view.

9. The display device of claim 7, wherein
the second data line is connected to the source/drain electrode of the transistor of the second pixel through a contact hole defined through the third insulating layer, and
the third data line is connected to the source/drain electrode of the transistor of the second pixel through a contact hole defined through the buffer layer, the first insulating layer, the second insulating layer and the third insulating layer.

10. The display device of claim 1, wherein the second data line includes a material having an electrical resistance less than an electrical resistance of the gate electrode.

11. The display device of claim 1, further comprising:
a plurality of pixel rows arranged along the predetermined direction,
wherein
the first pixel is included in an odd-numbered pixel row of the plurality of pixel rows, and
the second pixel is included in an even-numbered pixel row of the plurality of pixel rows.

12. The display device of claim 1, wherein the semiconductor layer includes at least one material selected from an amorphous silicon, a polycrystalline silicon, and a metal oxide.

13. A display device comprising:
a first pixel;
a second pixel adjacent to the first pixel in a predetermined direction;
a first data line extending in the predetermined direction and connected to the first pixel; and
a second data line extending in the predetermined direction and connected to the second pixel,
wherein
each of the first pixel and the second pixel includes:
a transistor including a conductive layer, a semiconductor layer disposed on the conductive layer, a gate electrode disposed on the semiconductor layer, and a source/drain electrode connected to the semiconductor layer; and
a light emitting device disposed on the transistor,
wherein
the first data line is disposed in a same layer as the source/drain electrode, and
the second data line is disposed in a same layer as the conductive layer.

14. The display device of claim 13, further comprising:
a buffer layer disposed between the conductive layer and the semiconductor layer;
a first insulating layer disposed between the semiconductor layer and the gate electrode; and
a second insulating layer disposed between the gate electrode and the source/drain electrode.

15. The display device of claim 14, wherein the second data line is connected to the source/drain electrode of the transistor of the second pixel through a contact hole defined through the buffer layer, the first insulating layer and the second insulating layer.

16. The display device of claim 13, wherein each of the first pixel and the second pixel further includes a capacitor including a first capacitor electrode disposed in a same layer as the conductive layer and a second capacitor electrode disposed on the first capacitor electrode.

17. The display device of claim 16, wherein the second capacitor electrode is disposed in a same layer as the gate electrode.

18. The display device of claim 16, wherein the second capacitor electrode is disposed in a same layer as the semiconductor layer.

19. A display device comprising:
a first pixel;
a second pixel adjacent to the first pixel in a predetermined direction;
a first data line extending in the predetermined direction and connected to the first pixel; and
a second data line extending in the predetermined direction and connected to the second pixel,
wherein
each of the first pixel and the second pixel includes:
a transistor including a semiconductor layer, a gate electrode disposed on the semiconductor layer, and a source/drain electrode connected to the semiconductor layer;
a capacitor including a first capacitor electrode disposed in a same layer as the gate electrode and a second capacitor electrode disposed on the first capacitor electrode; and
a light emitting device disposed on the transistor and the capacitor, and
wherein
the first data line is disposed in a same layer as the source/drain electrode, and
the second data line is disposed in a same layer as the second capacitor electrode.

20. The display device of claim 19, further comprising:
a first insulating layer disposed between the semiconductor layer and the gate electrode;
a second insulating layer disposed between the first capacitor electrode and the second capacitor electrode; and
a third insulating layer disposed between the second capacitor electrode and the source/drain electrode.

21. The display device of claim 20, wherein the second data line is connected to the source/drain electrode of the transistor of the second pixel through a contact hole defined through the third insulating layer.

* * * * *